United States Patent
He

(10) Patent No.: US 12,207,502 B2
(45) Date of Patent: Jan. 21, 2025

(54) OLED DISPLAY PANEL

(71) Applicant: Shenzhen China Star Optoelectronics Semiconductor Display Technology Co., Ltd., Guangdong (CN)

(72) Inventor: Hongyun He, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/614,339

(22) PCT Filed: Sep. 29, 2021

(86) PCT No.: PCT/CN2021/121642
§ 371 (c)(1),
(2) Date: Nov. 25, 2021

(87) PCT Pub. No.: WO2023/044945
PCT Pub. Date: Mar. 30, 2023

(65) Prior Publication Data
US 2024/0107813 A1 Mar. 28, 2024

(30) Foreign Application Priority Data

Sep. 24, 2021 (CN) .......................... 202111121974.1

(51) Int. Cl.
*H10K 59/122* (2023.01)
*H10K 59/80* (2023.01)
(52) U.S. Cl.
CPC ......... *H10K 59/122* (2023.02); *H10K 59/878* (2023.02)

(58) Field of Classification Search
CPC ............... H10K 59/122; H10K 59/878; H10K 50/8426; H10K 50/856
See application file for complete search history.

(56) References Cited

U.S. PATENT DOCUMENTS

| 2018/0026086 | A1 | 1/2018 | Adachi et al. |
| 2020/0373366 | A1* | 11/2020 | Sim ...................... H10K 59/124 |
| 2021/0335939 | A1* | 10/2021 | Li .......................... H10K 50/856 |
| 2022/0199695 | A1* | 6/2022 | Takiguchi ................. G09F 9/30 |

FOREIGN PATENT DOCUMENTS

| CN | 103681769 | 3/2014 |
| CN | 103872261 | 6/2014 |
| CN | 108183178 | 6/2018 |
| CN | 108461651 | 8/2018 |
| CN | 213071143 | 4/2021 |
| CN | 112965228 | 6/2021 |
| CN | 112968141 | 6/2021 |
| JP | 2004-259607 | 9/2004 |
| JP | 2009-065219 | 3/2009 |

\* cited by examiner

*Primary Examiner* — Kevin Quarterman

(57) ABSTRACT

The embodiments of the present application provide an OLED display panel. According to the OLED display panel provided by the embodiments in the present application, by disposing a first reflective layer on the wall of the through hole on the bank layer, since the first reflective layer is capable of reflecting light emitted to the wall of the through hole by the light emitting functional layer, the reflected light comes out from the second end of the through hole, so that the brightness and the light extraction efficiency of the OLED display panel can be enhanced, and the view angle can be expanded as well.

19 Claims, 3 Drawing Sheets

OLED DISPLAY PANEL

RELATED APPLICATIONS

This application is a National Phase of PCT Patent Application No. PCT/CN2021/121642 having International filing date of Sep. 29, 2021, which claims the benefit of Patent Application priority of Chinese No. 202111121974.1 filed on Sep. 24, 2021. The contents of the above applications are all incorporated by reference as if fully set forth herein in their entirety.

FIELD AND BACKGROUND OF THE INVENTION

The present application relates the field of display technology, and particularly to an OLED display panel.

OLED is a kind of current-type organic light-emitting device, in which the principle of luminescence is that the organic light-emitting material emits light by the injection and the recombination of charge carriers under the effect of electric field. OLED has great advantages in the display field due to its low driving voltage and simple manufacturing process. Compared to Liquid Crystal Display (LCD), OLED has advantages of being lighter, thinner, and lower apparent power consumption, so the research regarding to OLED is becoming more and more popular.

SUMMARY OF THE INVENTION

However, OLED still has some shortcomings, including low light extraction efficiency and narrow view angle and so on, which are important reasons to hinder the mass production and popularization of OLED.

The embodiment of the present application provides an OLED display panel, which has higher light output rate and wider view angle.

The embodiment of the present application provides an OLED display panel, comprising:
  a substrate;
  a bank layer, disposed on the substrate, wherein the bank layer has a through hole with a first end disposed close to the substrate and a second end disposed away from the substrate;
  a light emitting functional layer, disposed in the through hole; and
  a first reflective layer, disposed on a wall of the through hole, wherein the first reflective layer comprises a plurality of bump structures sequentially arranged in a direction from the first end of the through hole to the second end of the through hole.

In some embodiments, the bump structures comprise a first region and a second region connected to each other, and the first region and the second region are disposed along the direction from the first end of the through hole to the second end of the through hole;
  the thickness of the first region gradually increases and the thickness of the second region gradually decreases in the direction from the first end of the through hole to the second end of the through hole.

In some embodiments, the area of the first region is smaller than the area of the second region.

In some embodiments, the thickness of each of the bump structures is defined by the thickness at the position having the maximum thickness, and the thicknesses of the bump structures are gradually decreased in the direction from the first end of the through hole to the second end of the through hole.

In some embodiments, the thickness of the bump structure nearest to the first end of the through hole among the bump structures is 5 nm, and the thickness of the bump structure nearest to the second end of the through hole is 0.5 nm.

In some embodiments, the bump structures comprise a first body and a first insulating layer covering the outer surface of the first body, and the material of the first body is metal.

In some embodiments, the bump structures comprise a second body, an intermediate layer covering the outer surface of the second body, and a second insulating layer covering the outer surface of the intermediate layer, and the intermediate layer is made of metal.

In some embodiments, a second reflective layer is disposed between the light emitting functional layer and the substrate.

In some embodiments, the OLED display panel further comprises a cover, disposed on a side of the bank layer which is away from the substrate.

In some embodiments, the OLED display panel further comprises a thin film packaging layer, covering the bank layer, the wall of the through hole, and the light emitting functional layer in the through hole.

According to the OLED display panel provided by the embodiments in the present application, by disposing a first reflective layer on the wall of the through hole on the bank layer, since the first reflective layer is capable of reflecting light emitted to the wall of the through hole by the light emitting functional layer, the reflected light comes out from the second end of the through hole, so that the brightness and the light extraction efficiency of the OLED display panel can be enhanced. In addition, the embodiments in the present application provide the first reflective layer including a plurality of bump structures. Since the light beams reflected from different position have different angles when the light emits to the surface of the bump structures, the light comes out from the second end of the through hole can have different angles so that the view angle of the OLED display panel can be expanded.

BRIEF DESCRIPTION OF THE SEVERAL VIEWS OF THE DRAWINGS

In order to explain more clearly the technical solution in the present embodiment, the following is a brief introduction of the drawings described in the embodiments. Obviously, the drawings described below are only some embodiments of the present application. For the person having ordinary skill in the art, other drawings can be obtained from these drawings without any creative effort.

In order to make the present application and the beneficial effects thereof clearer and more specific, the present application is further described in detail below with reference to the accompanying drawings and examples, in which the same annotations in the drawings refer to the same portions in the following description.

DETAILED DESCRIPTION OF SPECIFIC EMBODIMENTS OF THE INVENTION

In order to make technical solutions of the present application being clearly and completely described, the present application is further described in detail below with reference to the accompanying drawings and examples. It should be understood that the specific embodiments described herein are only a portion of embodiments, but not all. Other embodiments obtained, without the creative effort, by person having ordinary skill in the art from the embodiments of the present application belong to the claim scope of the present application.

Figure 1:
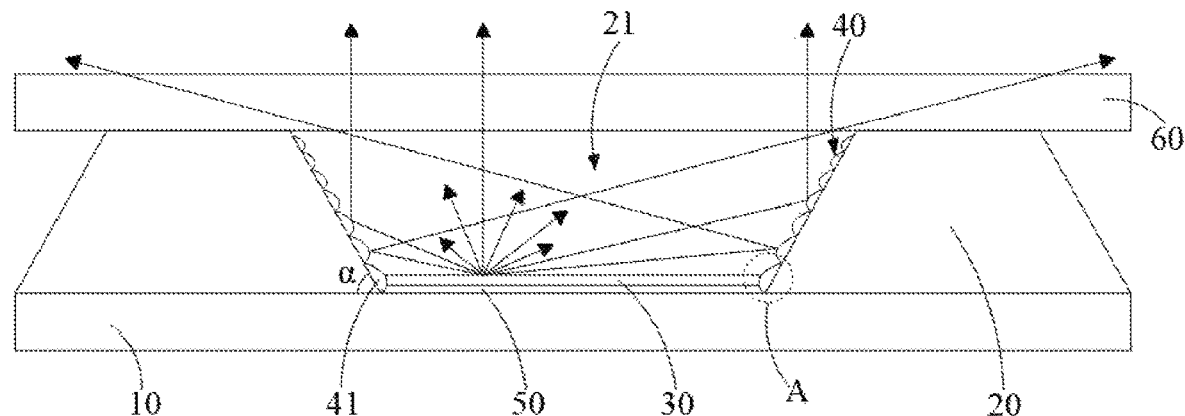
FIG. 1 is a schematic cross-sectional view of an OLED display panel according to a first embodiment of the present application.

Refer to FIG. 1, which is a schematic cross-sectional view of an OLED display panel according to a first embodiment of the present application. The present embodiment provides an OLED display panel 100 including a substrate 10, a bank layer 20, a light emitting functional layer 30, and a first reflective layer 40.

For example, the substrate 10 can be a rigid substrate or a flexible substrate. The rigid substrate can be made of glass, metal, and so on. The flexible substrate can be made of polymer materials such as Polyimide (PI).

In some exemplary embodiments, the material of the bank layer 20 can be organic material. The pattern on the bank layer 20 can be formed by photolithography process.

Further refer to FIG. 1, the bank layer 20 is disposed on the substrate 10, in which the bank layer 20 has a through hole 21 with a first end disposed close to the substrate 10 and a second end disposed away from the substrate 10. The angle α between the wall of the through hole 21 and the substrate 10 is an acute angle (which is greater 0° and less than 90°). That is, the area of the cross-section of the through hole 21 gradually increases in the direction from the first end of the through hole 21 to the second end of the through hole 21.

In some exemplary embodiments, the angle α between the wall of the through hole 21 and the substrate 10 can be 15°, 30°, 45°, 60°, 75°, and so on.

In some exemplary embodiments, the number of the through hole 21 disposed on the bank layer 20 can be multiple (two or more). The through holes 21 can be arranged in an array.

In some exemplary embodiments, the shape of the through hole 21 can be a circle, a rectangle, a square, a regular hexagon, etc.

Further refer to FIG. 1, the light emitting functional layer 30 can be disposed in the through hole 21.

It should be understood that the light emitting functional layer 30 in each through hole 21 is capable of emitting the light with single color (e.g., red light, green light, or blue light). The light emitting functional layers 30 in the adjacent three through holes 21 can emit red light, green light, and red light, respectively. By adjusting the intensity of the red light, green light, and blue light, mixture of different colors of light can be obtained.

Further refer to FIG. 1, the first reflective layer 40 is disposed on the wall of the through hole 21. The first reflective layer 40 comprises a plurality of bump structures 41 sequentially arranged in the direction from the first end of the through hole 21 to the second end of the through hole 21.

It should be understood that a portion of light comes out through the second end of the through hole 21 when the light emitting functional layer 30 emits light, and another portion of light emits to the first reflective layer 40 on the wall of the through hole 21. Through the reflection of the first reflective layer 40, the light blocked by the wall of the through hole 21 can be further utilized, thus increasing the light extraction efficiency of the OLED display panel 100 and the display brightness of the OLED display panel 100 as well.

Specifically, further refer to FIG. 1, it can be found that, among the bump structures 41 sequentially arranged in the direction from the first end of the through hole 21 to the second end of the through hole 21, a portion of light reflected by the bump structures 41 at the bottom (which is nearby the first end of the through hole 21) will be blocked and reflected by the bump structures 41 in the above (which is nearby the second end of the through hole 21). Because the size of the bump structures 41 gradually decrease from the bottom to the top (i.e., from the first end of the through hole 21 to the second end of the through hole 21), the ability of the above bump structures 41 to block the reflected light from the beneath bump structures 41 becomes weaker and weaker, and all light beams (i.e., the reflected light beams from all angles) reflected by the bump structures 41 at the top (which is closest to the second end of the through hole 21) come out through the second end of the through hole 21, so as to enlarge the angle range of the emitting light from the OLED display panel 100 and expand the view angle of the OLED display panel 100. Since the beam angle of the emergent light of the OLED display panel 100 is changed from a single angle to a variety of angles, the screen observed by users can be ensured to have basically the same brightness from different angles when the users watch the screen displayed by the OLED display panel 100.

According to the OLED display panel 100 provided by the embodiments in the present application, by disposing a first reflective layer 40 on the wall of the through hole 21 on the bank layer 20, since the first reflective layer 40 is capable of reflecting light emitted to the wall of the through hole 21 by the light emitting functional layer 30, the reflected light comes out from the second end of the through hole 21, so that the brightness and the light extraction efficiency of the OLED display panel 100 can be enhanced. In addition, the embodiments in the present application provide the first reflective layer 40 including a plurality of bump structures 41. Since the light beams reflected from different position have different angles when the light emits to the surface of the bump structures 41, the light comes out from the second end of the through hole 21 can have different angles so that the view angle of the OLED display panel 100 can be expanded.

Figure 2:
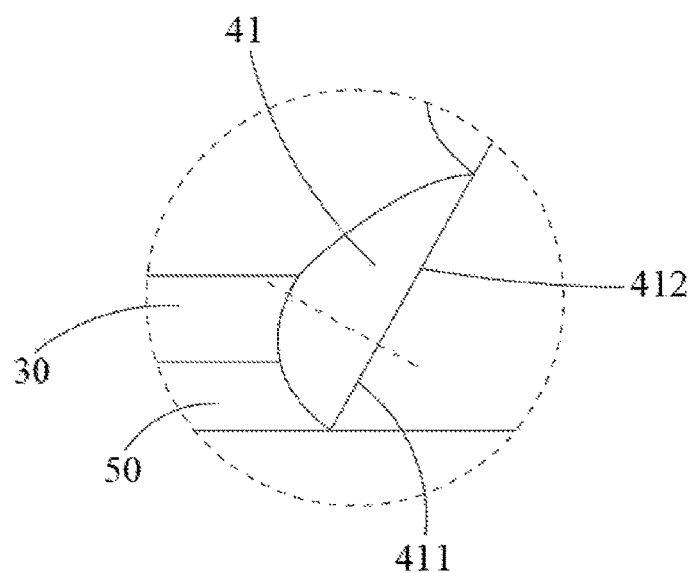
FIG. 2 is a schematic structural zoom-in diagram of region A according to FIG. 1.

Refer to FIG. 2, which is a schematic structural zoom-in diagram of region A according to FIG. 1. The bump structure 41 may include a first region 411 and a second region 412 connected to each other. The first region 411 and the second region 412 are disposed along the direction from the first end of the through hole 21 to the second end of the through hole 21. It should be noted that the dotted line in FIG. 2 is used merely to indicate the location of the dividing line between the first region 411 and the second region 412.

The thickness of the first region 411 gradually increases and the thickness of the second region 412 gradually decreases in the direction from the first end of the through hole 21 to the second end of the through hole 21.

It should be noted that with respect to the second region 412, it is beneficial to the reflected light coming out from the second end of the through hole 21 due to the decreasing thickness, so that the view angle can be improved. It should be further understood that when the thickness of the second region 412 gradually increases in the direction from the first end to the second end of the through hole 21, the light reflected by the beneath portion of the second region 412 (which is the portion close to the first end of the through hole 21) can be easily blocked by the above portion of the second region 412 (which is the portion close to the second end of the through hole) and reflected back to the bottom of the through hole 21 again, so that the light cannot come out from the second end of the through hole 21; when the thickness of the second region 412 is uniform in the direction from the first end to the second end of the through hole 21, the reflecting angles of the light reflected by any portion of the second region 412 are the same, so that the view angle cannot be enlarged; when the thickness of the second region 412 gradually decreases in the direction from the first end to the second end of the through hole 21, the light reflected by the beneath portion of the second region 412 (which is the portion close to the first end of the through hole 21) may not be blocked by the above portion of the second region 412 (which is the portion close to the second end of the through hole). Also, since the thickness of the second region 412 changes continuously, the light reflected by different portions of the second region 412 may have different angles, so that the view angle of the OLED display panel 100 can be expanded.

It can be understood that since the thickness of the first region 411 gradually increases in the direction from the first end of the through hole 21 to the second end of the through hole 21, as shown in FIG. 1 and FIG. 2, the light emitted to the surface of the first region 411 will be reflected to the bottom of the through hole 21, and coming out from the second end of the through hole 21 after multiple reflections. The light reflected by the first region 411 has different angles due to the changing thickness, and also comes out from the second end of the through hole 21 with different angles after the reflected light with multiple angles being further reflected many times. Thus, the view angle can be further expanded.

Further refer to FIG. 2, the area of the first region 411 may be less than that of the second region 412. It should be understood that when the light, emitted by the light emitting functional layer 30, is incident to the second region 412 of the bump structure 41, the light reflected by the second region 412 can directly come out from the second end of the through hole 21, without causing the energy loss. When the light is incident to the first region 411 of the bump structure 41, the light reflected by the surface of the first region 411 emits toward the bottom of the through hole 21 and comes out from the second end of the through hole after multiple reflections, and thus the energy of the light is lost in the process of the multiple reflections. Therefore, the present embodiment enhances the light extraction efficiency and the brightness of the OLED display panel 100 by designing the first region 411 to have the area smaller than the second region 412 (i.e., increasing the ratio of the second region 412 in the bump structure 41), and the energy loss and the decreasing of the light extraction efficiency in the process of the multiple reflections in the OLED display panel 100 can be avoided.

In some exemplary embodiments, the ratio of the area of the first region and the second region can be 1/2, 1/3, 1/4, 1/5, 2/3, 2/5, 3/5, 3/4, and so on.

Further refer to FIG. 1, the thickness of each of the bump structures 41 is defined by the thickness at the position having the maximum thickness. The thicknesses of the bump structures 41 gradually decrease in the direction from the first end of the through hole 21 to the second end of the through hole 21.

Further refer to FIG. 2, it can be found that the position having the maximum thickness of the bump structure 41 is at the dividing line between the first region 411 and the second region 412.

Further refer to FIG. 1, among these bump structures 41, the thickness of the bump structure 41 closest to the first end of the through hole 21, as shown in the bottom of FIG. 1, is 5 nm. The thickness of the bump structure 41 closest to the second end of the through hole 21, as shown in the top of FIG. 1, is 0.5 nm.

In some exemplary embodiments, the thickness difference between two adjacent bump structures 41 can be 1 nm, 0.9 nm, 0.8 nm, 0.7 nm, 0.6 nm, 0.5 nm, 0.4 nm, 0.3 nm, 0.2 nm, 0.1 nm, and so on.

It should be understood that the bump structures 41 can form a closed ring shape when observing from the top. The bump structures are parallel to each other and as well as parallel to the substrate 10.

Figure 3:
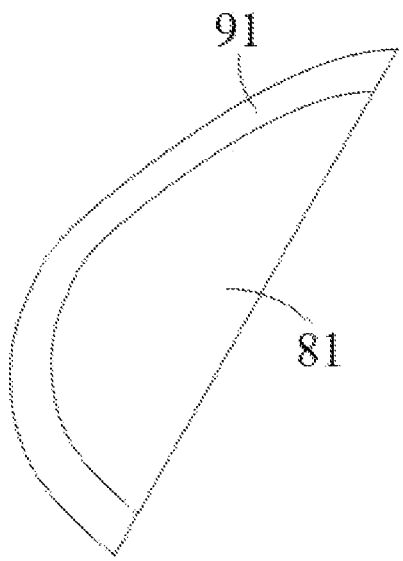
FIG. 3 is a schematic cross-sectional view of the bump structure in the OLED display panel according to a first embodiment of the present application.

Refer to FIG. 3, which is a schematic cross-sectional view of the bump structure in the OLED display panel according to a first embodiment of the present application. The bump structure 41 includes a first body 81 and a first insulating layer 91 covering the outer surface of the first body 81, and the material of the first body 81 is metal, such as gold, silver, and alloys thereof, etc. It should be understood that the first insulating layer 91 is made of a light transmissive material, for example, at least one of Silicon Nitride (SiNx) and Silicon Oxide (SiOx).

Figure 4:
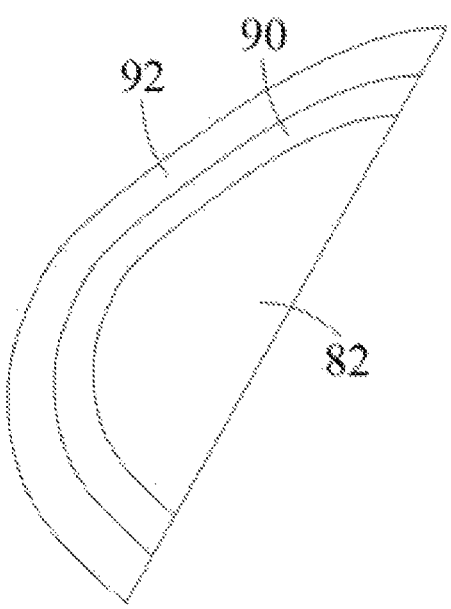
FIG. 4 is a schematic cross-sectional view of the bump structure in the OLED display panel according to a second embodiment of the present application.

Refer to FIG. 4, which is a schematic cross-sectional view of the bump structure in the OLED display panel according to a second embodiment of the present application. The bump structure 41 includes a second body 82, an intermediate layer 90 covering the outer surface of the second body 82, and a second insulating layer 92 covering the outer surface of the intermediate layer 90, and the intermediate layer 90 is made of metal, such as gold, silver, and alloys thereof, etc. In some exemplary embodiments, the material of the second body 82 includes polymer materials, such as Polycarbonate (PI), Polyethene (PE), and so on. It should be understood that the second insulating layer 92 is made of a light transmissive material, for example, the material of the second insulating layer 92 can include at least one of Silicon Nitride (SiNx) and Silicon Oxide (SiOx).

Further refer to FIG. 1, a second reflective layer 50 can be disposed between the light emitting functional layer 30 and the substrate 10. The second reflective layer 50 is capable of reflecting the light emitted toward the bottom of the through hole 21 by the light emitting functional layer 30, so as to enhance the brightness and the light extraction efficiency of the OLED display panel 100.

In some exemplary embodiments, the second reflective layer 50 can be made of metal, such as gold, silver, and alloys thereof, etc.

Further refer to FIG. 1, when the substrate 10 is a rigid substrate, the OLED display panel 100 can further include a cover 60, which can be disposed on a side of the bank layer 20 which is away from the substrate 10, for packaging the light emitting functional layer 30, and thus to avoid the performance of the light emitting functional layer 30 affected by water vapor and oxygen in the environment.

It should be understood that the cover 60 has a transparent structure, so that the light emitted by the light emitting functional layer 30 can pass through the cover 60 to make users can observe the display screen of the OLED display panel 100 from outside of the cover 60 (i.e., the side away from the bank layer 20). In some exemplary embodiments, the transmittance of the cover 60 can be greater than 50%, for example, 50%, 60%, 70%, 80%, 90%, 95%, 99%, and so on.

In some exemplary embodiments, the cover 60 can be a glass substrate.

Figure 5:
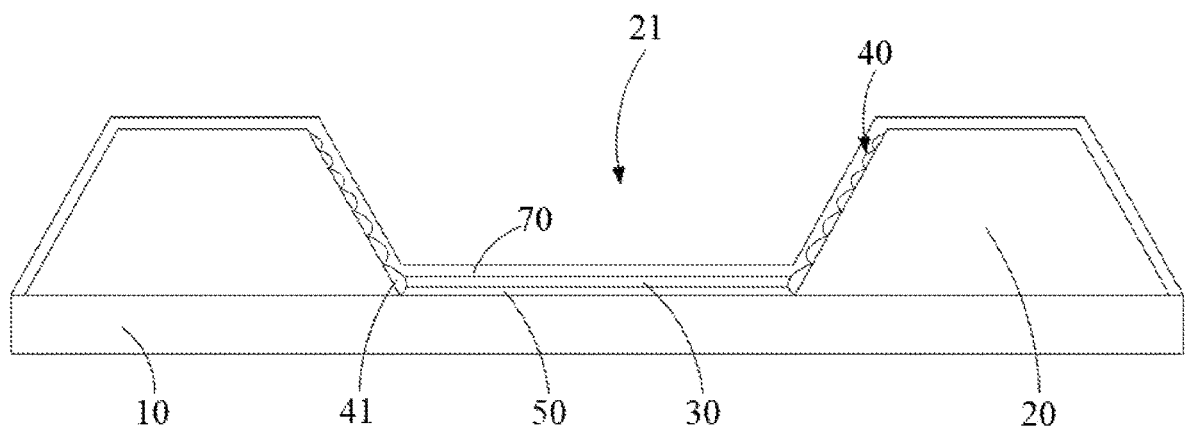
FIG. 5 is a schematic cross-sectional view of an OLED display panel according to a second embodiment of the present application.

Refer to FIG. 5, which is a schematic cross-sectional view of an OLED display panel according to a second embodiment of the present application. When the substrate 10 is a flexible substrate, the OLED display panel 100 further includes a thin film packaging layer 70. The thin film packaging layer 70 covers the bank layer 20, the wall of the through hole 21, and the light emitting functional layer 30 in the through hole 21, so as to prevent the performance of the light emitting functional layer 30 from affecting by the water vapor and oxygen in the environment. It should be understood that the thin film packaging layer 70 has the transparent structure too. In some exemplary embodiments, the transmittance of the thin film packaging layer 70 can be greater than 50%, for example, 50%, 60%, 70%, 80%, 90%, 95%, 99%, and so on.

In some exemplary embodiments, the light emitting functional layer 30 includes an anode, a hole injection layer, a hole transmission layer, a light emitting layer, an electronic transmission layer, an electronic injection layer, and a cathode, which are sequentially disposed between the first end of the through hole 21 and the second end of the through hole 21. The material of the anode can be transparent conductive metal oxide, such as Indium Tin Oxide (ITO), Indium Zinc Oxide (IZO), and so on. The material of the cathode can be metal materials, such as magnesium-silver alloys. The light emitted by the light emitting layer can come out from the cathode side by controlling the thickness of the cathode to become transparent or translucent.

In some embodiments, the light emitting functional layer 30 can be manufactured by using the inkjet printing technology. That is, the organic material is dissolved by solvent, and then the dissolved material (i.e., ink) is directly printed at the bottom of the through hole 21 of the bank layer 20. After drying, the solution becomes a film.

In some exemplary embodiments, when the ink of the inkjet is hydrophilic ink, the surface of the bank layer 20 away from the substrate 10 (i.e., the upper surface) can be hydrophobically treated to avoid the accumulation of the hydrophilic ink on the surface of the bank layer 20. Hydrophilic treatment can be carried out on the surface of the bump structures on the wall of the through hole 21 of the bank layer 20, so that the hydrophilic ink can be drained to the bottom of the through hole 21 by the bump structures 41.

Specific exemplary embodiments of the OLED display panel are used to explain the principle and implementation of the present application in the disclosure. However, the above embodiments are intended merely to assist in understanding the present application. It can be understood that those having ordinary skills of the art may easily contemplate various changes and modifications of the technical solution and technical ideas of the present application. In summary, the contents in the specification should not be considered as a limitation of the present application.

What is claimed is:

1. An OLED display panel, comprising:
    a substrate;
    a bank layer, disposed on the substrate, wherein the bank layer has a through hole with a first end disposed close to the substrate and a second end disposed away from the substrate;
    a light emitting functional layer, disposed in the through hole; and
    a first reflective layer, disposed on a wall of the through hole, wherein the first reflective layer comprises a plurality of bump structures sequentially arranged in a direction from the first end of the through hole to the second end of the through hole;
    wherein the thickness of each of the bump structures is defined by the thickness at the position having the maximum thickness, and the thicknesses of the bump structures gradually decrease in the direction from the first end of the through hole to the second end of the through hole.

2. The OLED display panel as claimed in claim 1, wherein the bump structures comprise a first region and a second region connected to each other, and the first region and the second region are disposed along the direction from the first end of the through hole to the second end of the through hole;
    the thickness of the first region gradually increases and the thickness of the second region gradually decreases in the direction from the first end of the through hole to the second end of the through hole.

3. The OLED display panel as claimed in claim 2, wherein the area of the first region is smaller than the area of the second region.

4. The OLED display panel as claimed in claim 3, wherein the ratio of the area of the first region and the second region is 1/2, 1/3, 1/4, 1/5, 2/3, 2/5, 3/5, or 3/4.

5. The OLED display panel as claimed in claim 1, wherein the thickness difference between two adjacent bump structures is 1 nm, 0.9 nm, 0.8 nm, 0.7 nm, 0.6 nm, 0.5 nm, 0.4 nm, 0.3 nm, 0.2 nm, or 0.1 nm.

6. The OLED display panel as claimed in claim 1, wherein the thickness of the bump structure nearest to the first end of the through hole among the bump structures is 5 nm, and the thickness of the bump structure nearest to the second end of the through hole is 0.5 nm.

7. The OLED display panel as claimed in claim 1, wherein the bump structures comprise a first body and a first insulating layer covering the outer surface of the first body, and the material of the first body is metal.

8. The OLED display panel as claimed in claim 7, wherein the material of the first insulating layer comprises at least one of Silicon Nitride and Silicon Oxide.

9. The OLED display panel as claimed in claim 8, wherein the bump structures comprise a second body, an intermediate layer covering the outer surface of the second body, and a second insulating layer covering the outer surface of the intermediate layer, and the intermediate layer is made of metal.

10. The OLED display panel as claimed in claim 9, wherein the material of the second insulating layer comprises at least one of Silicon Nitride and Silicon Oxide.

11. The OLED display panel as claimed in claim 1, further comprising:
    a second reflective layer, disposed between the light emitting functional layer and the substrate.

12. The OLED display panel as claimed in claim 11, wherein the material of the second reflective layer is metal.

13. The OLED display panel as claimed in claim 1, further comprising:

a cover, disposed on a side of the bank layer which is away from the substrate.

14. The OLED display panel as claimed in claim 13, wherein the cover has a transparent structure.

15. The OLED display panel as claimed in claim 1, further comprising:
a thin film packaging layer, covering the bank layer, the wall of the through hole, and the light emitting functional layer in the through hole.

16. The OLED display panel as claimed in claim 15, wherein the thin film packaging layer has a transparent structure.

17. The OLED display panel as claimed in claim 1, wherein the angle between the wall of the through hole and the substrate is an acute angle.

18. The OLED display panel as claimed in claim 1, wherein the bump structures are parallel to each other.

19. The OLED display panel as claimed in claim 1, wherein the substrate is a rigid substrate or a flexible substrate.

* * * * *